(12) United States Patent
Satsukawa

(10) Patent No.: US 7,521,761 B2
(45) Date of Patent: Apr. 21, 2009

(54) VARIABLE LAYOUT STRUCTURE FOR PRODUCING CMOS CIRCUIT

(75) Inventor: Yoshihiko Satsukawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/912,293

(22) Filed: Aug. 6, 2004

(65) Prior Publication Data
US 2005/0218459 A1    Oct. 6, 2005

(30) Foreign Application Priority Data
Mar. 30, 2004    (JP)    ............................. 2004-098222

(51) Int. Cl.
*H01L 23/62*    (2006.01)
(52) U.S. Cl. ..................... 257/350; 257/358; 257/359; 257/360; 257/363; 257/379; 257/380; 257/571
(58) Field of Classification Search ................ 257/379, 257/380, 489, 483, 350, 358, 359, 360, 363, 257/516, 533, 571
See application file for complete search history.

(56) References Cited

U.S. PATENT DOCUMENTS 6,400,300 B1 *    6/2002    Leung et al. ................ 341/154

2001/0040466 A1 *    11/2001    Ide ............................... 326/83

FOREIGN PATENT DOCUMENTS

| JP | 56-133865 | | 10/1981 |
| JP | 59-50557 | * | 3/1984 |
| JP | 59-200458 | | 11/1984 |
| JP | 62-277747 | | 12/1987 |
| JP | 64-7536 | * | 1/1989 |
| JP | 08-148938 | * | 7/1996 |

* cited by examiner

*Primary Examiner*—Evan Pert
*Assistant Examiner*—Tan N Tran
(74) *Attorney, Agent, or Firm*—Staas & Halsey LLP

(57) ABSTRACT

A layout structure for a CMOS circuit comprises a transistor layer forming P-type transistors 11 and 21 and N-type transistors 12 and 22, and a resistor layer which includes a resistor 13 formed to have a predetermined length and to make plural appropriate portions or the entire of the resistor along a direction of the length satisfy a mask rule necessary for providing VIAs, the resistor being connected to appropriate connecting portions of the P-type transistors and the N-type transistors through the VIAs by metal wires 31 formed of a metal layer, and the resistor having a predetermined circuit resistance which can be set based on the positions of the appropriate connecting portions.

3 Claims, 5 Drawing Sheets

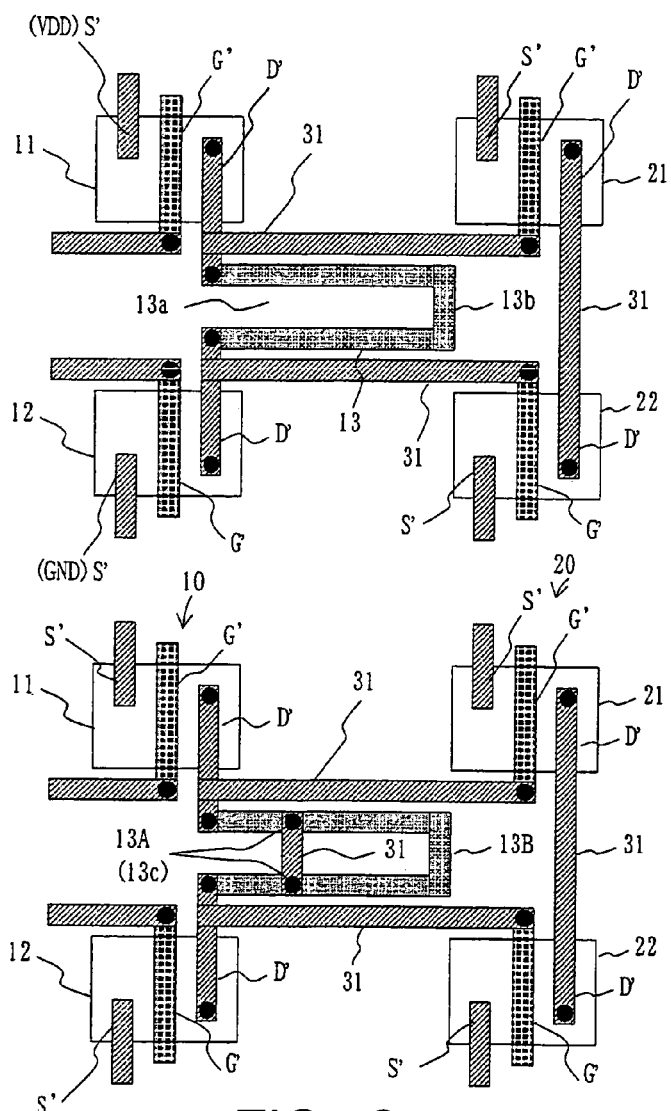
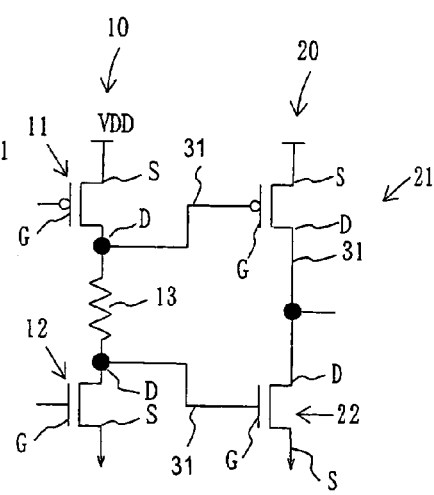
FIG.1A  FIG.1B
FIG.1C

VARIABLE LAYOUT STRUCTURE FOR PRODUCING CMOS CIRCUIT

BACKGROUND OF THE INVENTION

1. Field of the Invention

The present invention relates to a layout structure for a CMOS circuit, and particularly to a layout structure for a CMOS circuit which allows easy delay adjustment.

2. Description of the Related Art

In conventional CMOS circuits, timing adjustment is conducted at various points. For example, a delay circuit having an adjusted delay value is used for pulse width adjustment in chopping a clock signal to pulsate. FIG. 5 is a timing chart showing operations of the pulse width adjustment. A pulse signal (CK) denoted at (a) in FIG. 5 is delayed and inverted as indicated by (b). From the result of this and the original circuit, NAND is obtained so that a pulse as denoted at (c) can be obtained with a pulse width equal to a delay value. In this case, if the pulse width is too large, racing occurs on a path from the master output of a latch. Otherwise, if the pulse width is too small, no value may be latched or a delay value to a slave output may have an error.

Other examples are delay adjustment for restricting racing within a range in which no over-delay occur and clock phase adjustment for adapting flexibly an inter-cycle period to fit a data transfer velocity.

Although these adjustments are adopted in design stages, it often appears that designed adjustment values cannot be achieved in frequent cases due to problems of immature manufacturing processes or various calculation errors. In those cases, actual chips are fed back and subjected to measurements to specify the reasons. Thus, manufacturing data, e.g., the layout structure of the chips is modified, and the chips are remanufactured so that the designed adjustment values can be achieved.

With respect to layout structures of CMOS circuits, various techniques are known conventionally (for example, see Patent Literature 1: Japanese Patent Laid-Open No. 62-277747).

In such a modification of a layout structure in the prior art, widths and lengths of transistors are adjusted in general cases. For this purpose, the layout structure has to be modified totally throughout a diffusion layer (transistor layer), a resistor layer, and a metal layer (metal wire layer), and so requires a very long time and huge costs.

Meanwhile, if the modification of the layout structure can be achieved with a modification only to the metal layer as an upper layer, the layout structure adopted in chips being manufactured can be partially reflected directly on the lower layers such as resistor and diffusion layers below the metal layer. Then, not only the turn-around time can be reduced but also the costs required for manufacturing masks can be saved.

The present invention has been made to solve these conventional problems and has an object of providing a layout structure for a CMOS circuit in which a modification for delay adjustment to the layout structure of the CMOS circuit can be achieved by modifying only a metal layer as an upper layer, so that turn-around time can be reduced and mask manufacturing costs can be saved.

SUMMARY OF THE INVENTION

To achieve the above object, in the present invention, outputs of P-type and N-type transistors are connected by wires of a high-resistance layer, at gates in the driver side, to make a potential difference able to occur between the outputs of the P-type and N-type transistors. Further, the wires made of a high-resistance layer are made able to be bypassed by a metal layer, so that the resistance value can be varied by modifying the metal layer. In this respect, VIAs need to be provided between the metal layer and the high-resistance layer. The layout is hence arranged to satisfy mask rules even after VIAs are provided. Meanwhile, the circuit at gates in the receiver side is configured such that inputs of N-type and P-type transistors are separated from each other and are connected through a resistor of the gates in the driver side by the metal layer.

In another layout structure having the same circuit configuration as described above, the outputs of the P-type and N-type transistors are separated from each other at the gates in the driver side. At the gates in the receiver side, the inputs of the P-type and N-type transistors are connected by wires of a high-resistance layer, so that the point connecting the output of the driver or the resistance value can be varied by a modification to the metal layer.

More specifically, according to an aspect of the present invention, a layout structure for a CMOS circuit having a P-type transistor and an N-type transistor comprises: a transistor layer forming the P-type transistor and the N-type transistor; and a resistor layer which includes a resistor formed to have a predetermined length and to make plural appropriate portions or all of the resistor along a direction of the length satisfy a mask rule necessary for providing VIAs, the appropriate portions of the resistor being connected to appropriate connecting portions of the P-type transistor and the N-type transistor through the VIAs by metal wires formed of a metal layer, and the resistor having a predetermined circuit resistance which can be set based on the appropriate connecting portions.

In the layout structure for the CMOS circuit, the resistor formed in the resistor layer can be partially bypassed through the VIAs by the metal wires formed of the metal layer.

Also in the layout structure for the CMOS circuit, the P-type transistor and the N-type transistor formed in the transistor layer may be paired with each other, forming a driver circuit in a front stage and a receiver circuit in a next stage, and the resistor formed in the resistor layer may connect the driver circuit and the receiver circuit to each other through part of the resistor by the metal wires formed in the metal layer.

Further, in the layout structure for the CMOS circuit, the driver circuit and the receiver circuit may be connected to each other in a connection structure which is either a parallel type or a cross type. The resistor formed in the resistor layer may be connected to gates of the transistors forming the receiver circuit.

According to another aspect of the present invention, a layout structure for a CMOS circuit having a P-type transistor and an N-type transistor comprises: a transistor layer forming the P-type transistor and the N-type transistor; and a resistor layer which includes a resistor inserted between an output end of the P-type transistor and an output end of the N-type transistor and formed to make plural appropriate portions or all of the resistor satisfy a mask rule necessary for providing VIAs, the resistor being able to be bypassed through the VIAs by metal wires formed of a metal layer, to set a resistance value between the output ends of the P-type transistor and the N-type transistor.

In the layout structure for the CMOS circuit, a high-resistance wire based on polysilicon or local interconnection may be used as the resistor formed in the resistor layer.

According to further another aspect of the present invention, a layout structure for a CMOS circuit having a P-type transistor and an N-type transistor comprises: a transistor layer forming the P-type transistor and the N-type transistor; a resistor layer which includes a resistor formed to have a predetermined length and to make plural appropriate portions or all of the resistor along a direction of the length satisfy a mask rule necessary for providing VIAs; and a metal layer which includes metal wires capable of connecting the appropriate portions of the resistor to appropriate connecting portions of the P-type transistor and the N-type transistor through the VIAs, and capable of setting a predetermined circuit resistance based on the appropriate connecting portions, by the resistor.

According to further another aspect of the present invention, a layout structure for a CMOS circuit having a P-type transistor and an N-type transistor comprises: a transistor layer forming the P-type transistor and the N-type transistor; a resistor layer which includes a resistor inserted between an output end of the P-type transistor and an output end of the N-type transistor, and formed to make plural appropriate portions or all of the resistor satisfy a mask rule necessary for providing VIAs; and a metal layer which includes metal wires capable of bypassing a part or all of the resistor through the VIAs, to set a resistance value between the output ends of the P-type transistor and the N-type transistor.

As specifically described above, according to the present invention, the resistance value can be varied by modifying only the metal layer or the potentials of the P-type and N-type transistors can be adjusted by switching cross/parallel of connections between the driver and the receiver. The delay can thus be adjusted. If this layout structure is adopted, circuits can have a general transistor size avoiding a too short transistor width or too long transistor length. As a result, matching with a circuit simulation model can be improved and variants can be prevented from increasing. Thus, according to the present invention, actual chips can reflect a delay adjustment in a short time. The layer to be modified in the delay adjustment is restricted. Costs can hence be reduced. Further advantages are attained in that errors in simulation models and use of transistors having great variants can be avoided.

BRIEF DESCRIPTION OF THE DRAWINGS

FIGS. 1A to 1C show layout structures of a CMOS circuit in the embodiment 1, wherein FIG. 1A shows a layout before setting a resistance value (before modification), FIG. 1B shows the circuit shown in FIG. 1A with use of circuit symbol marks, and FIG. 1C shows a layout after setting a resistance value (after modification);

FIGS. 2A to 2C show resistors in a resistor layer wherein FIG. 2A shows a conventional resistor, FIG. 2B shows a resistor having plural VIA connecting positions, and FIG. 2C shows a resistor which can entirely serve as VIA connecting positions;

FIGS. 3A to 3C show layout structures of a CMOS circuit according to the embodiment 2 wherein FIG. 3A shows a layout before setting a resistance value (before modification), FIG. 3B shows the circuit shown in FIG. 3A with use of circuit symbol marks, and FIG. 3C shows a layout after setting a resistance value (after modification);

FIGS. 4A to 4D show layout structures of a CMOS circuit according to the embodiment 3 wherein FIG. 4A shows a layout before setting a resistance value (before modification), FIG. 4B shows the circuit shown in FIG. 4A, using circuit symbol marks, FIG. 4C shows a layout after setting a resistance value (after modification), and FIG. 4D shows the circuit shown in FIG. 4C with use of circuit symbol marks.

DETAILED DESCRIPTION OF THE PREFERRED EMBODIMENTS

Figure 2A:

An embodiment of the present invention will now be described with reference to the drawings.

Embodiment 1

FIGS. 1A to 1C show layout structures of a CMOS circuit in an embodiment 1. FIG. 1A shows a layout before setting a resistance value (before modification). FIG. 1B shows the circuit shown in FIG. 1A, using circuit symbol marks. FIG. 1C shows a layout after setting a resistance value (after modification).

The CMOS circuit shown in FIG. 1 is constructed by a driver 10 in a front stage and a receiver 20 in a rear stage. The driver 10 in the front stage has a P-type transistor 11, an N-type transistor 12, and a resistor 13 inserted between outputs of the transistors 11 and 12. The receiver 20 in the rear stage is constructed by a P-type transistor 21 and an N-type transistor 22. In these transistors 21 and 22, source S, gates G, and drains D are formed in the diffusion layer (transistor layer), and electrodes S', G', and D' thereof are formed below the metal layer which will be described later. For example, the gate electrodes G' may be formed with use of polysilicon, and the source electrodes S' and drain electrodes D' are formed with use of silicon. Metal wires are led and connected to these electrodes, as shown in the figures.

The resistor 13 is formed to obtain a circuit resistance (a predetermined circuit resistance) between the transistors 11 and 12. For example, high-resistance wires based on polysilicon or local interconnection are used and formed in the resistor layer. The metal layer formed above the resistor layer has a very low resistance value and therefore, needs an impracticable length to create such a resistance value that influences circuit operations. If the resistance value is thus forcedly created, a very large area is consumed and a large part of wiring areas is consumed. This makes it difficult to connect logic gates to each other. Although the resistor can be formed of a diffusion layer, the resistor can be created with a relatively smaller area and a relatively short distance by forming the resistor of a high-resistance wire made of polysilicon or the like.

Figure 2B:
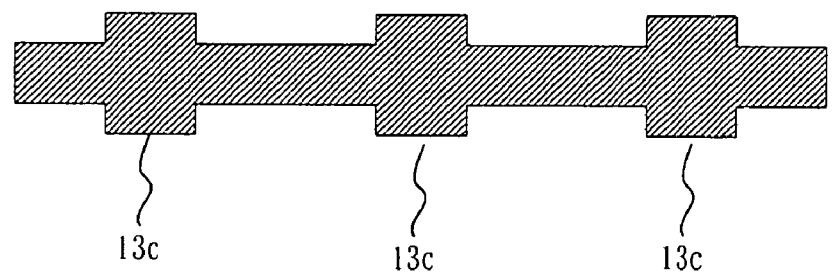
Figure 2C:
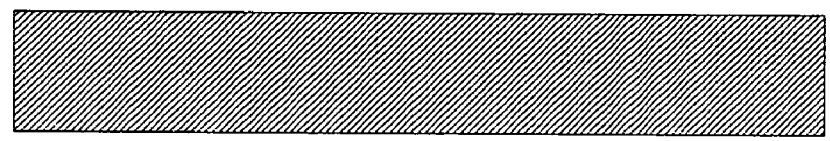

The resistor 13 is formed to have a predetermined length between the drain electrodes (or nodes close to the drain electrodes) of the P-type transistor 11 and the N-type transistor 12 of the driver 10. This resistor 13 is previously formed to be long so that the resistance value is greater relative to the design value. In the present embodiment, the shape of the resistor is formed in a substantially rectangular U-shape in which an open part 13a is faced to the drains of the driver 10 and a close part 13b is faced to the drains of the receiver 20. As shown in FIG. 2B, plural portions 13c (for example, FIGS. 1C, 3C and 4C) in the length direction thereof are formed to satisfy mask rules necessary for a VIA layout. Alternatively, as shown in FIG. 2C, the entire resistor 13 in its length direction may be formed to satisfy the mask rules necessary for the VIA layout. Note that FIG. 2A shows a conventional wire resistor and no VIA can be formed at any portion of the conventional resistor.

Next, metal wires 31 are formed in the metal layer. This metal layer is provided above the diffusion layer (transistor layer) and resistor layer described above. Further, as shown in FIG. 1B, the metal wires 31 connect, in parallel, the drain electrodes of the P-type transistor 11 and N-type transistor 12 of the driver 10 and the gate electrodes of the P-type transistor 21 and N-type transistor 22 of the receiver 20, respectively. A predetermined portion 13B which includes the close part 13*b* of the resistor 13 formed in substantially rectangular U-shape, is bypassed if necessary.

When the resistance value is modified (decreased) based on an evaluation result with respect to an actual device, the bypass position 13A (13C) is set according to the modification amount. That is, the more the bypassing amount is increased, the more the resistance value can be made small. In this case, the resistor 13 is previously formed such that the resistance value is relatively great, and plural portions or all of the resistor is formed to allow provision of VIAs. Therefore, the resistance value can be varied easily (i.e., a design modification can be carried out to satisfy an evaluation value) by only modifying (selecting and connecting appropriate VIAs) connecting positions (bypass positions) of the metal wires in the metal layer.

As described above, in the embodiment 1, the resistor 13 is inserted between the P-type transistor 11 and N-type transistor 12 of the driver 10, and the P-type transistor 21 and N-type transistor 22 of the receiver 20 are connected to each other through a metal layer. The P-type transistor 11 of the driver 10 is connected to the P-type transistor 21 of the receiver 20, as well as the N-type transistor 12 of the driver 10 to the N-type transistor 22 of the receiver 20, in parallel.

At this time, the drain (or node close to the drain) of the P-type transistor 11 of the driver 10 easily becomes close to the VDD potential. Therefore, the drive ability of the P-type transistor 21 of the receiver 20 is weakened. Likewise, the drive ability of the N-type transistor 22 of the receiver 20 is weakened. If part or all of the resistor 13 is bypassed through the metal wires 31, the resistance value can be reduced so that the above-mentioned effect of weakening the drive ability can be reduced. A layout modification of this kind to adjust the drive ability can be achieved by modifying only the metal layer in the layout structure. In the present embodiment, the resistor 13 is formed in a rectangular U-shape having a close portion 13*c*. It is hence possible to obtain a large bypass amount from such an amount of short metal wires that bypasses the close portion 13*c*. A greater reduction in the resistance value can be easily obtained.

Embodiment 2

Figure 3A:
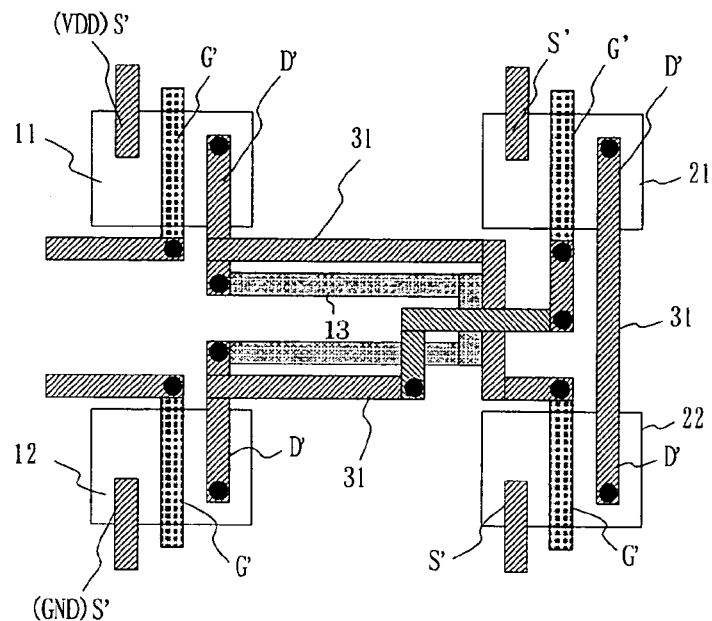
Figure 3B:
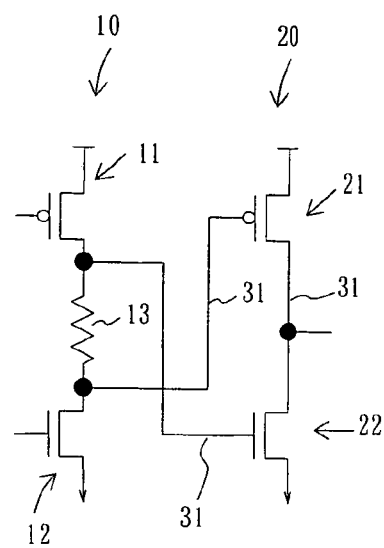
Figure 3C:
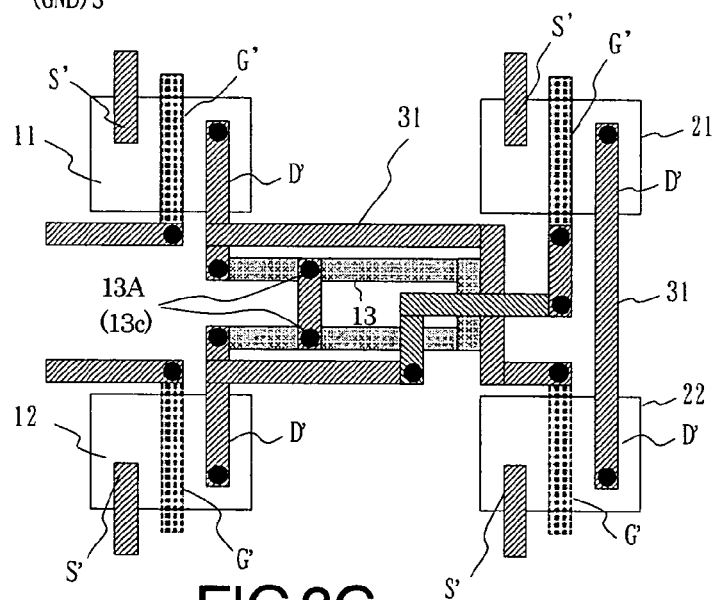

FIGS. 3A to 3C show layout structures of a CMOS circuit according to the embodiment 2. FIG. 3A shows a layout before setting a resistance value (before modification). FIG. 3B shows the circuit shown in FIG. 3A, using circuit symbol marks. FIG. 3C shows a layout after setting a resistance value (after modification). Reference symbols identical to those in FIGS. 1 denote the identical components.

The foregoing embodiment 1 has been described in the case where the metal wires between the driver 10 and the receiver 20 are parallel to each other. The present embodiment 2 will be described in the case where the metal wires cross each other.

Also in the present case, the resistor 13 is inserted between the P-type transistor 11 and N-type transistor 12 of the driver 10. However, the P-type transistor 21 and N-type transistor 22 of the receiver 20 are cross-connected, i.e., the P-type transistor 11 of the driver 10 is connected to the N-type transistor 22 of the receiver 20, as well as the N-type transistor 12 of the driver 10 to the P-type transistor 21 of the receiver 20, through metal wires (a metal layer) as shown in FIG. 3A.

At this time, the drain (node) of the P-type transistor 11 of the driver 10 becomes easily close to the VDD potential. Therefore, the drive ability of the N-type transistor 22 of the receiver 20 is strengthened. Likewise, the drive ability of the P-type transistor 21 of the receiver 20 is strengthened. The resistance value can be reduced by bypassing part or all of the resistor through the metal layer, so that the above-mentioned effect of strengthening the drive ability can be reduced. A layout modification of this kind to adjust the drive ability can be achieved by modifying only the metal layer in the layout structure.

Embodiment 3

Figures 4A, 4B:
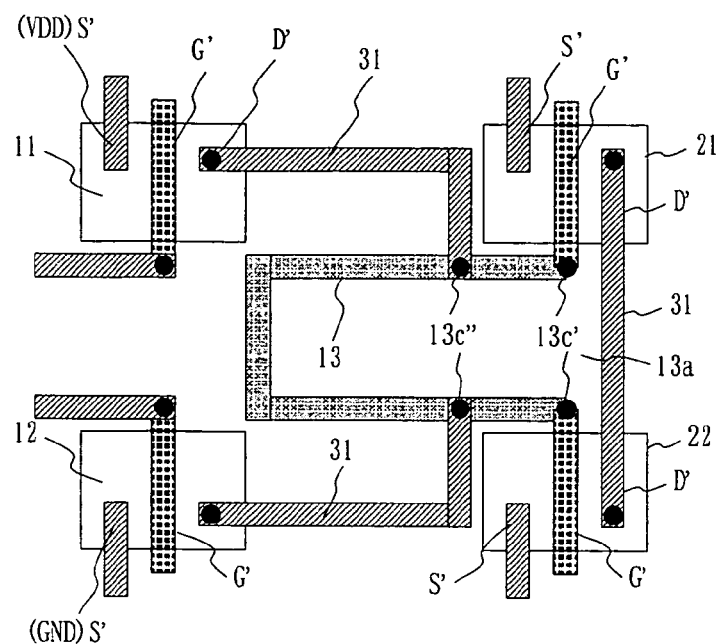
Figures 4C, 4D:
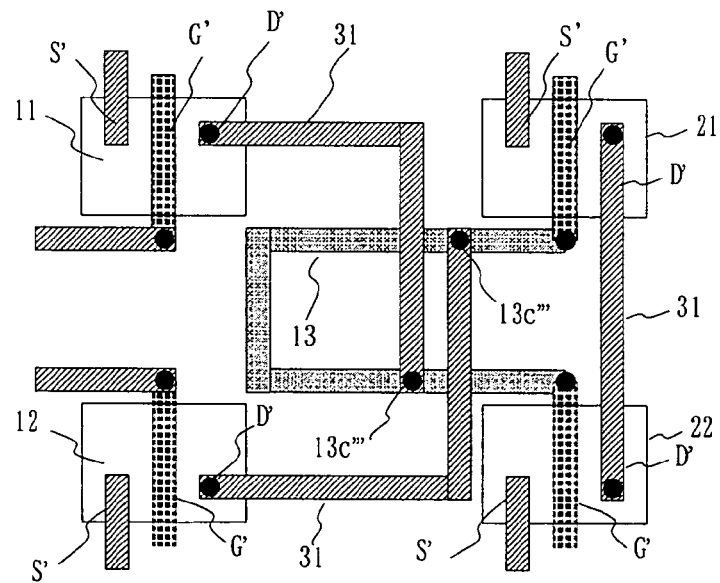
Figure 5:
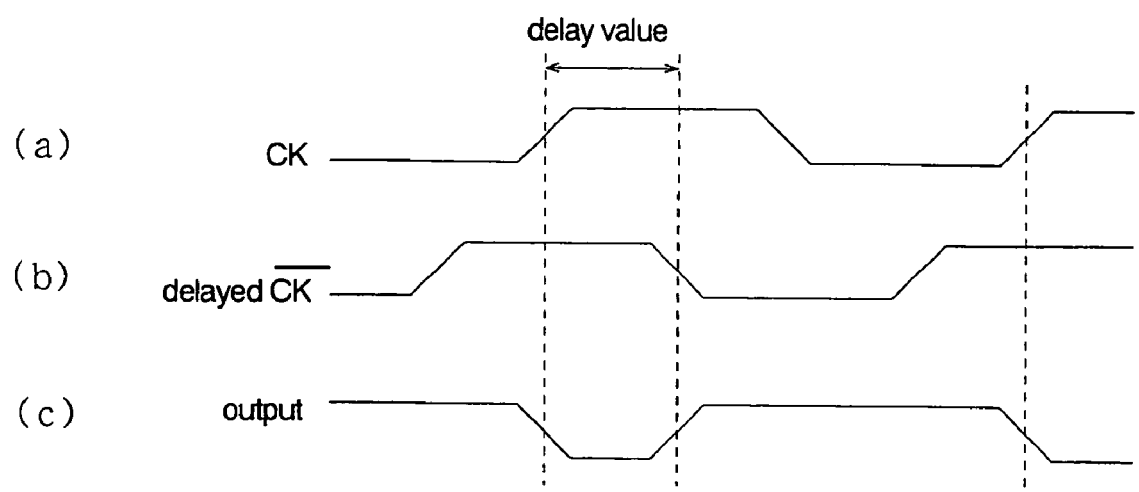
FIG. 5 is a timing chart showing operations of pulse width adjustment.

FIGS. 4A to 4D show layout structures of a CMOS circuit according to the embodiment 3. FIG. 4A shows a layout before setting a resistance value (before modification). FIG. 4B shows the circuit shown in FIG. 4A, using circuit symbol marks. FIG. 4C shows a layout after setting a resistance value (after modification). FIG. 4D shows the circuit shown in FIG. 4C, using circuit symbol marks. Reference symbols identical to those in FIGS. 1 denote the identical components.

In the embodiment 3, the resistor 13 is provided to connect the gate electrodes G' of the P-type transistor 21 and N-type transistor 22 of the receiver 20, through VIAs near these transistors. The drains (nodes) of the P-type transistor 11 of the driver 10 and the N-type transistor 12 of the driver 10 are connected to appropriate two portions 13*c*" of the gate electrodes G'. In this connection relationship, as shown in FIG. 4B, the driver 10 and the receiver 20 are parallel to each other (like FIG. 3A). The resistor 13 has a substantially rectangular U-shape like in the case of FIGS. 1. However, the open portion 13*a* of the resistor 13 is faced in an opposite direction to that in the case of FIGS. 1. Specifically, the open portion 13*a* is open toward the receiver 20. The two open ends of this portion are respectively connected to the gate electrodes (or nodes close to the gate electrodes) of the transistors 21 and 22 of the receiver 20.

In contrast, as shown in FIG. 4C, the connecting positions of metal wires on the resistor 13 are modified (from 13*c*" to 13*c*'"). Then, the resistance value between the P-type transistor 11 and N-type transistor 12 of the driver 10 can be changed, and the connection between the driver 10 and the receiver 20 can be modified to a cross type as shown in FIG. 4D.

That is, the outputs of the P-type transistor 11 and N-type transistor 12 of the driver 10 are connected through a metal layer to connecting points among the input nodes of the receiver 20. By selecting the connecting points, a choice of parallel or cross is available, and the resistance value (or predetermined circuit resistance) between the P-type transistor 11 and the N-type transistor 12 can be varied. In addition, the resistance value (or predetermined circuit resistance) between the P-type transistor 21 and the N-type transistor 22 can be varied by bypassing part of the resistor.

What is claimed is:

1. A circuit comprising:
   a plurality of circuit elements, a first element comprising a first electric terminal, and a second circuit element comprising a second electric terminal;
   a resistor layer in which a resistor element having a predetermined length is formed thereon, a first end of said resistor element is connected to said first electric terminal, and a second end of said resistor element is connected to said second terminal; and
   a metal layer in which a metal portion is formed thereon, a first end of said metal portion is connected to a first portion of said resistor element through a first VIA, and a second end of said metal portion is connected to a second portion of said resistor element through a second VIA, shortcutting said resistor element by connecting said first portion and second portion by said metal portion to determine a resistance value of said resistor element.

2. The circuit according to 1 wherein said resistor element is formed in a looped shape.

3. A circuit comprising:

a plurality of circuit elements, a first element comprising a first electric terminal, and a second circuit element comprising a second electric terminal;

a resistor layer in which a first resistor element connected to said first electric terminal, and a second resistor element connected to said second electric element are formed thereon, said first resistor element and said second resistor element are aligned to be positioned side by side; and a metal layer in which a metal portion is formed thereon, a first end of said metal portion is connected to said first resistor element at an optional position through a first VIA and a second end of said metal portion is connected to said second resistor element at an optional position through a second VIA.

* * * * *

UNITED STATES PATENT AND TRADEMARK OFFICE
CERTIFICATE OF CORRECTION

PATENT NO. : 7,521,761 B2 Page 1 of 1
APPLICATION NO. : 10/912293
DATED : April 21, 2009
INVENTOR(S) : Yoshihiko Satsukawa It is certified that error appears in the above-identified patent and that said Letters Patent is hereby corrected as shown below:

Column 7, Line 8, change "1" to --claim 1--.

Signed and Sealed this

Twenty-first Day of July, 2009

JOHN DOLL
*Acting Director of the United States Patent and Trademark Office*